US005945853A

United States Patent
Sano

[19]

[11] Patent Number: 5,945,853
[45] Date of Patent: Aug. 31, 1999

[54] CURRENT SENSING CIRCUIT WITH AUTOMATIC OFFSET COMPENSATION

[75] Inventor: Masato Sano, Sumoto, Japan

[73] Assignee: Sanyo Electric Co., Ltd., Osaka, Japan

[21] Appl. No.: 09/063,890

[22] Filed: Apr. 22, 1998

[30] Foreign Application Priority Data

Apr. 24, 1997 [JP] Japan ..................................... 9-107448

[51] Int. Cl.⁶ .................................................. H03K 5/153
[52] U.S. Cl. ............................................. 327/87; 327/307
[58] Field of Search ..................................... 327/307, 362, 327/363, 77, 78, 79, 87, 89, 560–563

[56] References Cited

U.S. PATENT DOCUMENTS

| | | | |
|---|---|---|---|
| 3,989,959 | 11/1976 | Renirie et al. | 327/362 |
| 5,103,122 | 4/1992 | O'Leary et al. | 327/307 |
| 5,166,632 | 11/1992 | MacKenzie | 327/307 |
| 5,798,664 | 8/1998 | Nagahori et al. | 327/307 |

FOREIGN PATENT DOCUMENTS 7-77546  3/1995  Japan .............................. G01R 19/25

*Primary Examiner*—Toan Tran
*Attorney, Agent, or Firm*—Wenderoth, Lind and Ponack, L.L.P.

[57] ABSTRACT

The current sensing circuit with automatic offset compensation is provided with a current sensing resistor, a difference amplifier which inputs this current sensing resistor voltage at its voltage measuring input terminal and inputs a reference voltage at its reference voltage terminal, and a measuring circuit which determines the current flowing in the current sensing resistor from the difference amplifier output voltage. The current sensing circuit adds a small bias voltage to the current sensing resistor voltage and inputs it to the voltage measuring input terminal to increase difference amplifier output voltage. The measuring circuit measures difference amplifier output voltage and compensates the reference voltage input to the difference amplifier reference voltage terminal to compensate difference amplifier output to 0V when current sensing resistor current is zero.

12 Claims, 5 Drawing Sheets

CURRENT SENSING CIRCUIT WITH AUTOMATIC OFFSET COMPENSATION

BACKGROUND OF THE INVENTION

This invention relates to an improvement of a current sensing circuit which measures current from the voltage drop across the two terminals of a current sensing resistor, and in particular to a current sensing circuit provided with a circuit to automatically compensate for the offset voltage of a difference amplifier which amplifies the current sensing resistor voltage.

A current sensing circuit measures current from the voltage drop developed across the two terminals of a current sensing resistor. This can be done because the voltage drop across the current sensing resistor is proportional to the current. The voltage drop across the two terminals of the current sensing resistor is the product of the current sensing resistor value and the current. Since the current sensing resistor is connected in series with the load, it is desirable for the resistor value to be as small as possible. This is because electric power consumed by the current sensing resistor is wasted power. Since electric power consumed by the current sensing resistor increases in proportion to the resistor value, the current sensing resistor value should be as small as possible to reduce power consumption.

However, as the value of the current sensing resistor is reduced, the voltage drop across the two terminals of the resistor also decreases. Therefore, it is necessary to amplify the voltage drop across the current sensing resistor with a difference amplifier. In principle, if the voltage across the current sensing resistor is amplified by a difference amplifier under ideal conditions, accurate current measurement should be possible when the current sensing resistor value has been reduced significantly. However, The difference amplifier produces a non-zero output voltage even when the input voltage is zero. This is the so-called "offset voltage" of the difference amplifier. For example, if a difference amplifier with an input referred offset voltage of 10 mV is used to amplify a voltage signal with a maximum input voltage of 100 mV, the offset voltage reaches 10% of the maximum input voltage. The offset voltage is the cause of current sensing circuit error.

A current sensing circuit with difference amplifier offset voltage compensation for accurate current measurement is cited in Japanese Non-examined Patent Publication No.7-77546 issued on Mar. 20, 1995. Turning to FIG. 1, the current sensing circuit cited in this disclosure is shown. In the current sensing circuit of FIG. 1, the output of difference amplifier 1 is converted to a digital value by analog to digital (A/D) converter 2. A switching device 4 is connected in series with current sensing resistor 3. The output of A/D converter 2 when the switching device 4 is in the off state, namely when current in the current sensing resistor is zero, is used as the zero-point for current measurement. For example, if the A/D converter 2 output voltage is 0.5V when current through the current sensing resistor 3 is zero, current measurements are made with a 0.5V output voltage used as the reference voltage. Current is thereby measured with difference amplifier 1 offset voltage compensation.

The current sensing circuit of FIG. 1 has the characteristic that the effect of difference amplifier 1 offset voltage is eliminated and current can be accurately measured. However, this circuit has the problem that it cannot utilize 100% of the difference amplifier 1 output voltage range for current measurement and measurement accuracy is thereby reduced. Specifically, when difference amplifier 1 offset voltage is considered, the output voltage range is reduced. In the circuit described in this disclosure, the current sensing resistor 3 value is made small to reduce resistive power loss. As a result, the voltage drop developed across the current sensing resistor 3 is small and the effect of offset voltage increases. For example, a current sensing circuit using a 0.1 W current sensing resistor 3 for measuring 0A to 0.5A currents develops a maximum voltage of 50 mV across the current sensing resistor 3. In this case, if the difference amplifier 1 has a ±15 mV offset voltage and can linearly amplify a 50 mV input voltage, the situation is as shown in FIG. 2. Here the output voltage range which is usable for current sensing is limited to 50 mV–(15×2)mV, or only 20 mV. The difference amplifier 1 can amplify linearly in the range from 30 mV to 50 mV and this range can be used for current measurement. Therefore, since the range of voltages input to the difference amplifier 1 is limited, and since this range is used to sense currents in the range of 0A to 0.5A, the current sensing circuit of FIG. 1 has the drawback that current cannot be measured with high accuracy.

Further, since the current sensing circuit of FIG. 1 uses microcomputer 5 to compensate for offset voltage from difference amplifier 1 output and calculate current, it also has the drawback that microcomputer 5 computation is time consuming. This is because each time the microcomputer 5 calculates a current value, it compensates for offset voltage.

The present invention was developed with the object of overcoming these types of drawbacks. Thus a primary object of the present invention is to provide a current sensing circuit with automatic offset compensation which can measure current accurately with high precision and which can calculate current values with simple and fast computations.

The above and further objects and features of the invention will more fully be apparent from the following detailed description with accompanying drawings.

SUMMARY OF THE INVENTION

The current sensing circuit with automatic offset compensation of the present invention is provided with a current sensing resistor, a difference amplifier with current sensing resistor voltage input to a voltage measuring input terminal and a reference voltage input to a reference voltage terminal, and a measurement circuit which determines the current flowing through the current sensing resistor from the output voltage of the difference amplifier.

Further, the current sensing circuit with automatic offset compensation of the present invention is configured to add an extremely small bias voltage to the current sensing resistor voltage input to the voltage measuring input terminal to increase the output voltage of the difference amplifier. In addition, the measurement circuit determines the output voltage of the difference amplifier and compensates the reference voltage input to the reference voltage terminal of the difference amplifier such that difference amplifier output voltage is zero when current through the current sensing resistor is zero.

The measurement circuit can be realized with an A/D converter to convert difference amplifier output voltage to a digital value, a computation circuit to compute difference amplifier offset compensation voltage from A/D converter output and to control the switching device on and off, a digital to analog (D/A) converter to convert the digital value computed by the computation circuit to an analog value, and an input compensation circuit to input D/A converter output to the reference voltage terminal of the difference amplifier and compensate the offset voltage of the difference amplifier.

The measurement circuit computes difference amplifier offset compensation voltage from difference amplifier output when current flowing through the current sensing resistor is set to zero. The offset compensation voltage is converted to an analog value by the D/A converter and input to the reference voltage terminal of the difference amplifier via the input compensation circuit to compensate the difference amplifier output voltage to zero.

The computation circuit compares A/D converter output voltage with the smallest digital value greater than zero when current flowing through the current sensing resistor is zero. When A/D converter output is equal to the minimum digital value, D/A converter output is further compensated and used as the offset compensation voltage. This offset compensation voltage is input to the reference voltage terminal of the difference amplifier.

This configuration of current sensing circuit has the feature that it can accurately measure current with high precision. This is because the current sensing circuit compensates offset voltage at the input side of the difference amplifier. In this type of current sensing circuit, offset voltage does not limit the usable range for current measurement as shown in FIG. 2. This is because offset voltage is compensated at the input side of the difference amplifier and the entire output range of the difference amplifier can be used for current sensing.

Further, since the current sensing circuit compensates for offset voltage at the input side of the difference amplifier, once the offset voltage has been compensated, current values can be easily calculated from the output of the difference amplifier. Therefore, these simple calculations are performed rapidly and the feature that current values can be quickly computed is realized.

DETAILED DESCRIPTION OF THE INVENTION

Figure 1:
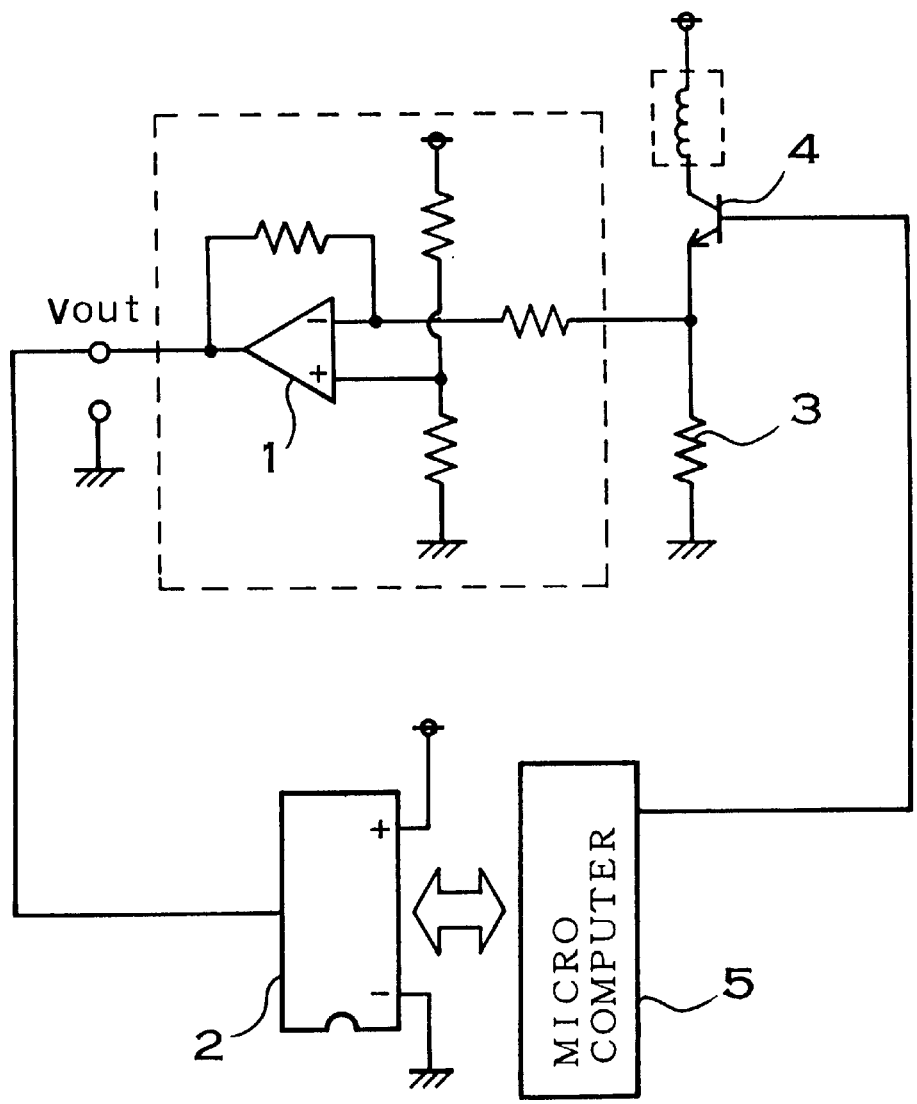
FIG. 1 is circuit diagram of a prior art current sensing circuit with automatic offset compensation.
Figure 2:
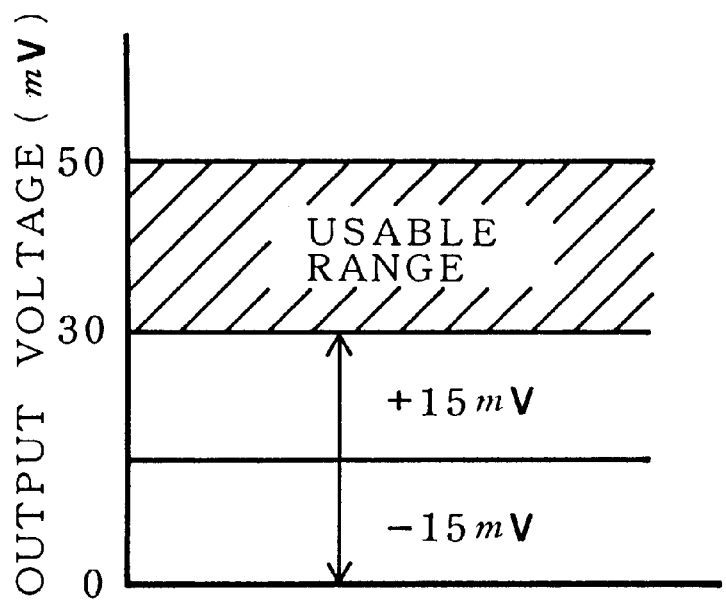
FIG. 2 is a graph showing the output voltage range which can be used for current measurement by the current sensing circuit of FIG. 1.
Figure 3:
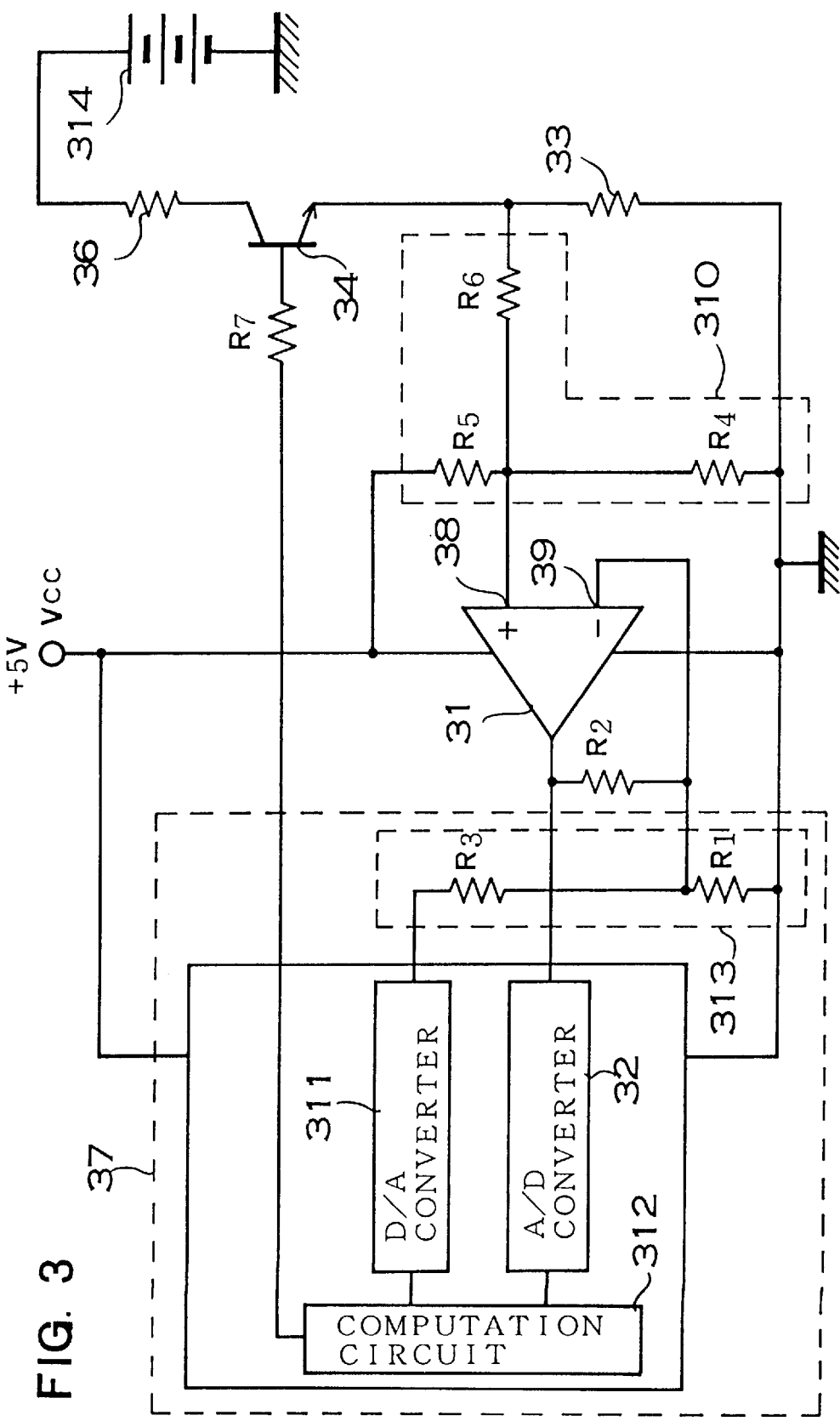
FIG. 3 is a circuit diagram of an embodiment of the current sensing circuit with automatic offset compensation of the present invention.

Turning to FIG. 3, the current sensing circuit with automatic offset compensation shown is provided with a current sensing resistor 33 which is connected in series with a load 36 via a switching device 34, a difference amplifier 31 which amplifies current sensing resistor 33 voltage, and a measurement circuit 37 which performs calculations with difference amplifier 31 output to determine the current flowing through the current sensing resistor 33.

As small as possible a resistor value is used for the current sensing resistor 33 considering the maximum current to be measured. For example, in the case where 0A to 10A of current are measured, the current sensing resistor 33 value is taken to be 10 mW.

The difference amplifier 31 is not the type that operates on ±supply voltages, but rather is a single supply type of operational amplifier (op-amp) that operates on either a +supply or a −supply. This type of difference amplifier 31 cannot produce ±output voltages. For example, for an op-amp powered by a positive supply +Vcc, output voltages range from greater than 0V to less than the supply voltage +Vcc.

The difference amplifier 31 amplifies and outputs voltages input to its ±input terminals. In the difference amplifier 31 of FIG. 3, the +input terminal is taken to be the measurement voltage input terminal (or the voltage measuring terminal) 38, and the −input terminal is taken to be the reference voltage terminal 39. The voltage measuring terminal 38 is connected to the current sensing resistor 33 through resistor $R_6$ and is connected to Vcc of the difference amplifier 31 through resistor $R_5$ which is a component of a small bias voltage circuit 310.

The small bias voltage circuit 310 inputs an extremely small positive bias voltage to the difference amplifier 31 +input terminal, which is the voltage measuring terminal 38. This small positive bias voltage is larger in magnitude than the equivalent maximum negative offset voltage reflected to the input side of the difference amplifier 31. The small bias voltage circuit 310 divides the supply voltage Vcc of the difference amplifier 31 with resistors $R_5$ and $R_4$ to input bias voltage to the voltage measuring terminal 38. For example, when the equivalent offset voltage reflected to the input side of the difference amplifier 31 is ±15 mV, the small bias voltage is set to a value greater than 15 mV. The small bias voltage is set by the values of resistors $R_5$, $R_4$, $R_6$, and the current sensing resistor 33.

D/A converter 311 output is voltage divided by resistors $R_3$ and $R_1$ and input to the reference voltage terminal 39 of the difference amplifier 31. Offset compensation voltage is input to the reference voltage terminal 39 such that the output voltage of the difference amplifier 31 is compensated to 0V when current flowing in the current sensing resistor 33 is zero. Further, a negative feedback resistor $R_2$ is connected between the difference amplifier 31 output terminal and the −input terminal, and amplifier gain is adjusted by its value.

The measurement circuit 37 is provided with an A/D converter 32 to convert difference amplifier 31 output voltage to a digital value and input it to a computation circuit 312, the computation circuit 312 to compute difference amplifier 31 offset compensation voltage from A/D converter 32 output and to control the switching device 34 on and off, a digital to analog (D/A) converter 311 to convert the digital value computed by the computation circuit 312 to an analog value, and an input compensation circuit 313 to input D/A converter 311 output to the reference voltage terminal 39 of the difference amplifier 31 and compensate the offset voltage of the difference amplifier 31.

The measurement circuit 312 turns the switching device 34 off and computes difference amplifier 31 offset compensation voltage from the difference amplifier 31 output when current flowing through the current sensing resistor 33 is zero. The offset compensation voltage is converted to an analog value by the D/A converter 311 and input to the reference voltage terminal 39 of the difference amplifier 31 via the input compensation circuit 313. The offset compensation voltage compensates the difference amplifier 31 offset voltage making its output voltage zero.

Figure 4:
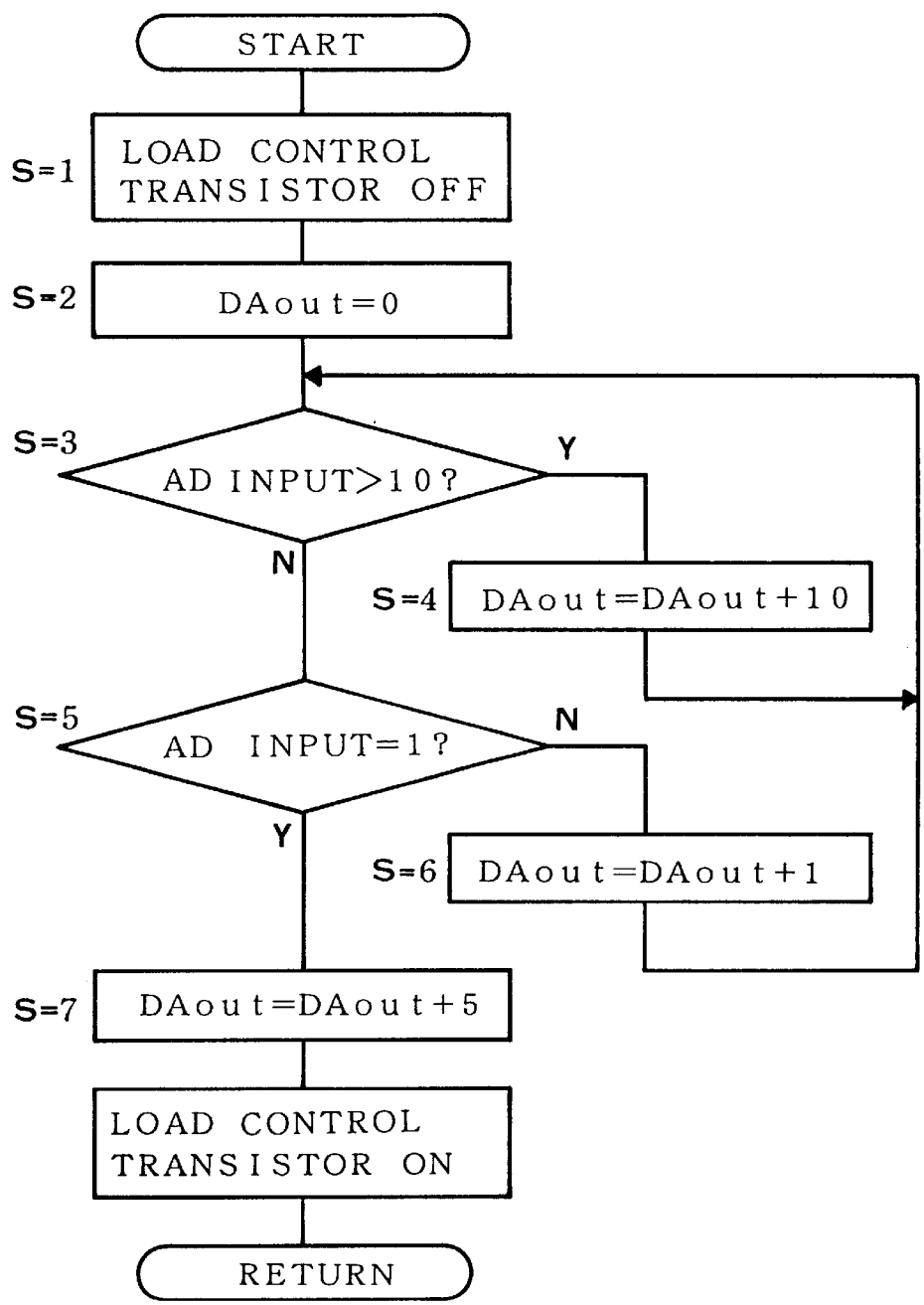
FIG. 4 is a flowchart showing the steps for offset compensation voltage calculation by the computation circuit.

As shown by the flowchart of FIG. 4, the computation circuit 312 calculates offset compensation voltage in the following manner. However, numeric values shown in FIG. 4 are digital values. A/D values are 8 bit, and 0 to 255 represent 0V to 5V. D/A values are 9 bit, and 0 to 511 represent 0V to 5V. Consequently, the A/D voltage value is found by multiplying by 5/255 and the D/A voltage value is found by multiplying by 5/511.

Step S=1

In this step, the computation circuit 312 turns the switching device 34 off making the current through the current sensing resistor zero.

Step S=2

The computation circuit 312 sets D/A converter 311 output to zero.

Step S=3

The computation circuit 312 judges whether or not the input voltage from the A/D converter 32 is greater than 10.

Step S=4

If the input voltage to the computation circuit 312 from the A/D converter 32 is greater than 10, then 10 is added to the output of the D/A converter 311. In other words D/A converter 311 output voltage is increased by 10/511V. Control loops through this step until AND converter 32 output voltage becomes less 10. Each time control loops through this step, D/A converter 311 output is increased by 10.

Step S=5

The computation circuit 312 judges whether or not the input voltage from the A/D converter 32 is equal to 1.

Step S=6

Control loops through steps S=5, S=6, and S=3 until the input voltage to the computation circuit 312 from the A/D converter 32 is equal to 1. Each time control loops through this step, D/A converter 311 output is increased by 1.

Step S=7

When the input voltage to the computation circuit 312 from the A/D converter 32 is equal to 1, then 5 is added to the output of the D/A converter 311. The reason 5 is added to the output of the D/A converter 311 is because resistor values of the input compensation circuit 313 are selected for difference amplifier 31 offset voltage compensation when 5/511V is added to D/A converter 311 output corresponding to A/D converter 32 output voltage dropping to 1/255V.

As described above, input voltage to the computation circuit 312 from the A/D converter 32 is not judged by whether or not it is zero, but rather by whether or not it is the minimum value above zero (1 in the embodiment above). A computation method which further compensates D/A converter 311 output at that point can compensate extremely accurately for difference amplifier 31 offset voltage. When voltage at the reference voltage terminal 39 is greater than voltage at the voltage measuring input terminal 38 the voltage input to the computation circuit 312 from the A/D converter 32 becomes zero independent of the size of the voltage difference between the difference amplifier 31 input terminals. A method that compares the voltage input to the computation circuit 312 from the A/D converter 32 with 1 sets a specified value for the voltage difference between the voltage measuring input terminal 38 and the reference voltage terminal 39. Therefore, offset compensation voltage can be calculated with even greater accuracy.

Figure 5:
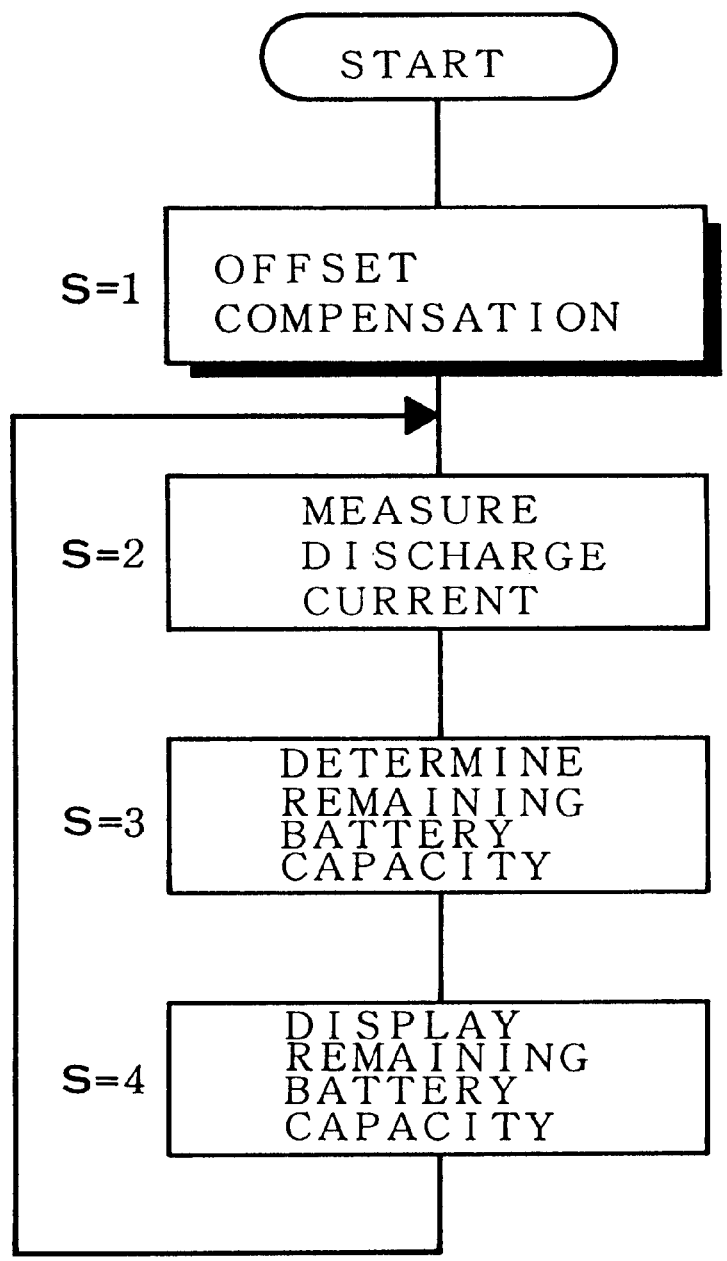
FIG. 5 is a flowchart showing the steps for determining remaining battery capacity using the current sensing circuit shown in FIG. 3.

Turning to FIG. 5, a flowchart is shown which determines remaining capacity of a battery using the current sensing circuit of the present invention. As shown in FIG. 3, the current sensing circuit is connected to a battery 314 via the load 36. The current sensing circuit is connected in series with the load 36 and determines the current flowing in the load 36.

In the flowchart of FIG. 5, remaining battery capacity is calculated by the following steps.

Step S=1

In this step, difference amplifier 31 offset voltage is compensated.

Step S=2

Difference amplifier 31 output is used for computations to determine the discharge current of the battery 314.

Step S=3

The discharge current is integrated to determine the remaining battery capacity of battery 314. Remaining battery capacity is calculated by subtracting the discharge capacity from the initial capacity of the charged battery 314.

Step S=4

The calculated remaining battery capacity of battery 314 is displayed.

Subsequently, control loops back to step S=2 and remaining battery 314 capacity is displayed.

In the flowchart of FIG. 5, offset compensation is performed only once at the beginning before starting remaining battery 314 capacity computations. In the case where the difference amplifier 31 experiences offset drift due to conditions such as temperature variation, offset compensation can be performed periodically.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A current sensing circuit with automatic offset compensation comprising:
   (1) a current sensing resistor;
   (2) a difference amplifier with current sensing resistor voltage input to its voltage measuring input terminal, and a reference voltage input to its reference voltage terminal;
   (3) a small bias voltage circuit which adds a small bias voltage to the current sensing resistor voltage input to the difference amplifier voltage measuring input terminal to make difference amplifier output voltage larger; and
   (4) a measurement circuit to measure difference amplifier output voltage, compensate the reference voltage input to the difference amplifier reference voltage terminal such that difference amplifier output is compensated to 0V when current sensing resistor current is zero, and also to measure current flowing in the current sensing resistor from the output voltage of the difference amplifier.

2. A current sensing circuit with automatic offset compensation as cited in claim 1 wherein the small bias voltage circuit inputs a small positive bias voltage to the difference amplifier voltage measuring input terminal which is larger in magnitude than the largest negative equivalent offset voltage reflected to the input side of the difference amplifier.

3. A current sensing circuit with automatic offset compensation as cited in claim 1 wherein the small bias voltage circuit voltage divides supply voltage and inputs it to the difference amplifier.

4. A current sensing circuit with automatic offset compensation as cited in claim 1 wherein the difference amplifier is an op-amp of the type which operates on a positive supply or on a negative supply (single supply type).

5. A current sensing circuit with automatic offset compensation as cited in claim 1 wherein the difference amplifier non-inverting input terminal is taken to be the voltage measuring input terminal, and the inverting input is taken to be the reference voltage terminal.

6. A current sensing circuit with automatic offset compensation as cited in claim 1 wherein a switching device which is controlled on and off by the measuring circuit is connected in series with the current sensing resistor, and the measuring circuit turns the switching device off to make the current sensing resistor current zero.

7. A current sensing circuit with automatic offset compensation as cited in claim 6 wherein the measuring circuit is provided with an A/D converter to convert difference amplifier output voltage to a digital value, a computation circuit to determine difference amplifier offset compensation voltage by performing computations on the A/D converter output and also to control the switching device on and off, a D/A converter to convert results computed by the computation circuit to analog values, and an input compensation circuit to input D/A converter output to the difference amplifier reference voltage terminal and compensate difference amplifier offset; and wherein the computation circuit calculates difference amplifier offset compensation voltage from difference amplifier output when current sensing resistor current is zero, the D/A converter converts this offset compensation voltage to an analog value, the input compensation circuit inputs this voltage to the difference amplifier reference voltage terminal, and it compensates the difference amplifier output voltage to 0V.

8. A current sensing circuit with automatic offset compensation as cited in claim 7 wherein the computation circuit compares A/D converter output voltage when current sensing resistor current is zero to a minimum value greater than zero, and when A/D converter output is equal to the minimum value, D/A converter output is further compensated to give the offset compensation voltage which is input to the difference amplifier reference voltage terminal.

9. A current sensing circuit with automatic offset compensation as cited in claim 1 wherein the current sensing resistor is a resistor which senses battery load current.

10. A current sensing circuit with automatic offset compensation as cited in claim 1 wherein the current sensing resistor is a resistor which determines remaining battery capacity from battery load current.

11. A current sensing circuit with automatic offset compensation as cited in claim 1 wherein the measurement circuit compensates difference amplifier offset voltage at fixed periodic intervals.

12. A current sensing circuit with automatic offset compensation as cited in claim 1 wherein the measurement circuit compensates offset voltage at the start of current measurement with the current sensing resistor.

* * * * *